United States Patent
Savage et al.

(10) Patent No.: US 8,903,029 B2
(45) Date of Patent: Dec. 2, 2014

(54) MONOBIT RECEIVER SPURIOUS HARMONICS CONTROL METHOD AND SYSTEM

(75) Inventors: Lee M. Savage, Santa Barbara, CA (US); Ronak D. Shah, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/398,639

(22) Filed: Feb. 16, 2012

(65) Prior Publication Data

US 2013/0216010 A1 Aug. 22, 2013

(51) Int. Cl.
| | | |
|---|---|---|
| *H03D 1/04* | (2006.01) | |
| *H03D 1/06* | (2006.01) | |
| *H03K 5/01* | (2006.01) | |
| *H03K 6/04* | (2006.01) | |
| *H04B 1/10* | (2006.01) | |
| *H04L 1/00* | (2006.01) | |
| *H04L 25/08* | (2006.01) | |

(52) U.S. Cl.
USPC .......................................................... 375/346

(58) Field of Classification Search
USPC .......................................................... 375/346
See application file for complete search history.

(56) References Cited

U.S. PATENT DOCUMENTS

| | | | |
|---|---|---|---|
| 6,549,068 B1* | 4/2003 | Bollenbeck .................. | 330/129 |
| 2002/0093855 A1* | 7/2002 | Heyne et al. .................. | 365/194 |
| 2008/0304405 A1* | 12/2008 | Lindoff et al. ............... | 370/210 |
| 2009/0003499 A1* | 1/2009 | Chiu et al. .................... | 375/347 |
| 2009/0021303 A1* | 1/2009 | Vinayak et al. .............. | 330/127 |
| 2010/0283659 A1* | 11/2010 | Huggett ........................ | 342/20 |

OTHER PUBLICATIONS

Grajal J. et al., "Monobit Receiver For Electronics Warfare", Statistical Signal Processing, 2001, Proceedings of the 11th IEEE Sign A1 Processing Workshop on Aug. 6-8, 2001, Piscataway, NJ, USA, IEEE, Aug. 6, 2001 (pp. 138-141).
Written Opinion of the International Searching Authority for International Application No. PCT/US2013/021042, filed Jan. 10, 2013, Written Opinion of the International Searching Authority mailed Apr. 5, 2013 (4 pgs.).
International Search Report for International Application No. PCT/US2013/021042, filed Jan. 10, 2013, International Search Report dated Mar. 27, 2013 and mailed Apr. 5, 2013 (3 pgs.).

* cited by examiner

*Primary Examiner* — Tanmay Shah
(74) *Attorney, Agent, or Firm* — Christie, Parker & Hale, LLP

(57) ABSTRACT

A method for minimizing unwanted signal harmonics from at least one signal in a channel received through a monobit receiver, comprising: conditioning (312) the channel, determining (318, 320) relative strength between two frequency components of a signal within the channel, and using that relative strength (322) to control (324) how the channel is conditioned. In other embodiments, a system for receiving signals in a channel and minimizing unwanted harmonics from those signals has a monobit receiver (104, 204), a channel conditioner (124, 228, 230), and a feedback driver (114, 118, 208, 216, 218, 224) determining relative strength (116, 122, 220, 222, 226) between two frequency components of a received signal and using that determination to control the channel conditioner in a way that urges the relative strength toward a desired value.

16 Claims, 4 Drawing Sheets

MONOBIT RECEIVER SPURIOUS HARMONICS CONTROL METHOD AND SYSTEM

BACKGROUND OF INVENTION

Monobit signal receivers are relatively small and inexpensive, and are therefore useful for electronic warfare and other applications where signal reception with small size and low cost are beneficial or critical. On the other hand, monobit receivers are highly nonlinear and suffer a significant drawback that they tend to generate relatively high levels of unwanted received-signal frequency harmonics, typically odd harmonics. These unwanted harmonics factor as noise that can obscure detection of desired signals. It is known to remediate the unwanted harmonics by flooding the receiver input channel with broad-spectrum noise, but such a static dose of noise has the unwanted side effect of degrading receiver sensitivity to desired signals perhaps below acceptable minimums. A better method of controlling and remediating unwanted received-signal harmonics would increase the ability to use monobit receivers.

SUMMARY OF INVENTION

Embodiments in accord with the present invention take advantage of a nonlinear characteristic of monobit receivers, namely that higher-order harmonic signal components disproportionately attenuate when the receiver input signal is conditioned in certain ways, such as by attenuation of the overall input channel or by introduction of broad-spectrum noise. These channel conditioning methods do decrease the receiver's signal to noise ratio (SNR), however, and so a balance must be struck between decreased unwanted harmonics and decreased receiver sensitivity.

Accordingly, certain embodiments of the present invention manage the trade-off between harmonics rejection and SNR. In certain embodiments of the present invention, monitoring the power ratio between a signal's fundamental frequency and one of its harmonics, or else between two of its harmonics, coupled with closing a control loop back to an input channel conditioner for the monobit receiver, provides a method of realizing a desired balance for the particular application being pursued.

According to certain embodiments, the present invention is directed to a method for minimizing unwanted signal harmonics from at least one signal in a channel received through a monobit receiver, comprising the steps of conditioning the channel, determining an aspect of relative strength between at least two frequency components of a signal within the channel, and using the determined aspect of relative strength to control a manner in which the channel is conditioned.

In some of these embodiments, two of the signal's frequency components upon which the step of determining an aspect of the relative strength is performed are the fundamental frequency and the third harmonic frequency. In other of these embodiments, the method includes selecting at least two of the signal's frequency components to be used in performing the step of determining an aspect of the relative strength. In certain of these embodiments, conditioning the channel comprises attenuating the channel; in other of these embodiments, conditioning the channel comprises adding noise to the channel. In other of these embodiments, the step of using the determined aspect of relative strength to control a manner in which the channel is conditioned further comprises determining a variance between the determined signal strength and a preselected value.

In other of these embodiments, the method's step of determining an aspect of the relative strength comprises determining a power ratio between at least two least two frequency components of the signal. In other of these embodiments, the method comprises the step of selecting a particular relative strength level to be maintained between the two frequency components in conditioning the channel. In other of these embodiments, the method comprises the step of selecting an algorithm by which a result of the relative strength determination controls the conditioning of the channel. In other of these embodiments, the method comprises the step of selecting a signal from the channel. In other of these embodiments, the method comprises the step of dynamically changing at least one of signal selection, feedback algorithm selection, frequency components selection, or target power ratio selection.

According to other embodiments, the present invention is directed to a system for receiving at least one signal in a channel and minimizing unwanted signal harmonics from at least one signal received in that channel, comprising a monobit receiver disposed to receive at least one signal within an input channel, a channel conditioner in communication with an input of the monobit receiver and disposed to process the input channel and capable of altering a relative strength as received by the monobit receiver between at least two frequency components of a signal within the channel, and a feedback driver in communication with an output of the monobit receiver and in communication with a control input of the channel conditioner, disposed to determine an aspect of a relative strength between at least two frequency components of a received signal within the channel and disposed to use that determination for control of the channel conditioner in a manner that urges an aspect of relative strength between at least two frequency components toward a desired value.

In some of these embodiments, the feedback driver comprises a first comparator in communication with an output of the monobit receiver and disposed to determine an aspect of a relative strength between at least two frequency components of a received signal within the channel, and also a second comparator that is in communication with an output of the first comparator and disposed to determine a variance between the determined aspect of relative strength and a target value for an aspect of relative strength, and also in communication with a control input of the channel conditioner and disposed to use the determined variance to control the channel conditioner in a manner that urges an aspect of relative strength between at least two frequency components towards the target value for an aspect of relative strength. In some of these embodiments, the feedback driver comprises at least one discriminator in communication with an output of the monobit receiver and disposed to determine at least one aspect of the strength of at least one frequency component of a signal received by the monobit receiver.

In some of these embodiments the channel conditioner comprises an attenuator disposed to increase attenuation of the channel when it receives a control signal indicating that the strength of a higher-order frequency component of a received signal relative to the strength of a lower-order frequency component of that received signal is larger than desired; in other of these embodiments the channel conditioner comprises a noise generator disposed to add noise to the channel and to increase the amplitude of that noise in the channel when it receives a control signal indicating that the strength of a higher-order frequency component of a received signal relative to the strength of a lower-order frequency component of that received signal is larger than desired.

DETAILED DESCRIPTION

Embodiments in accord with the present invention take advantage of a nonlinear characteristic of monobit receivers, namely that higher-order harmonic signals disproportionately attenuate when the receiver input channel is conditioned in certain ways, such as by attenuation of the channel or by addition of broad-spectrum noise to the channel. (The input channel is of course itself simply a composite signal, but the word "signal" is herein reserved to refer to a particular source's signal, including its various frequency components, as received within the composite signal that is the "channel" which may contain many such signals; in turn, the term "frequency component" as used herein may mean the fundamental frequency or any of the frequency harmonics of a signal.) These channel conditioning methods do decrease receiver SNR, however, and so a balance must be struck between decreased unwanted harmonics and decreased receiver sensitivity. In certain embodiments of the present invention, monitoring the power ratio between two of a signal's frequency components, coupled with closing a control loop back to an input channel conditioner feeding the monobit receiver, provides a method of realizing a desired balance for the particular application.

Figure 4:
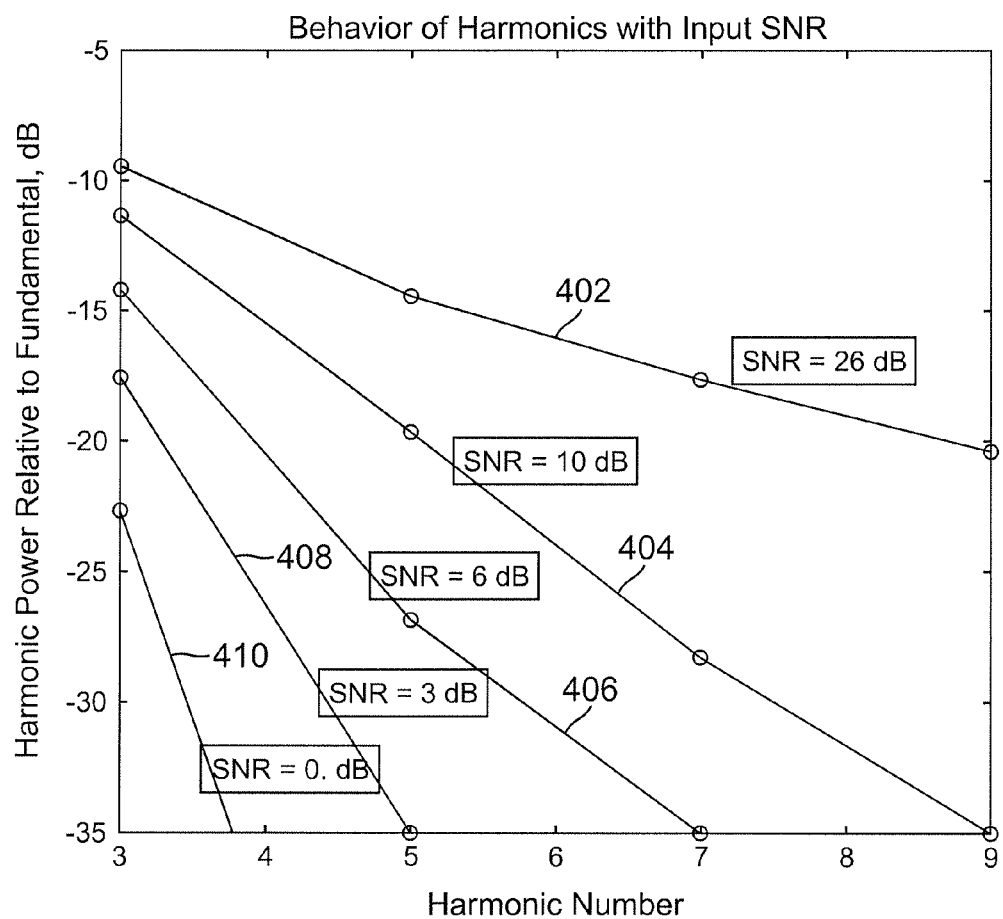
FIG. 4 is a chart demonstrating empirical results for attenuation of higher-order harmonics at various input channel attenuation settings in a particular monobit receiver test setup.

Increasing attenuation of the channel being fed into the monobit receiver of course reduces the amplitude of any signal within the channel and all the frequency components of such a signal as received by the monobit receiver. However, due to the nonlinearity of monobit receivers the harmonics do not all decrease by the same amount; instead, the higher-order harmonics all decrease or "roll off" by successively greater relative amounts. FIG. 4 illustrates the performance of a typical monobit receiver at different levels of attenuation and demonstrates this phenomenon. The harmonic strength profile of a particular received signal at a particular, minimal level of attenuation and maximal level of SNR is plotted there as 402. The harmonic strength profiles of that same signal at successively increased levels of attenuation, indicated on the figure as decreasing levels of SNR, are plotted as 404, 406, 408 and 410. The increasing slopes of the successive plots reflect the increasing rate of harmonic roll-off as attenuation is increased. Due to this nonlinear phenomenon, increasing the attenuation in this particular test setup such that the power of the third harmonic frequency relative to the fundamental frequency decreases from a level of −10 dB down to −17 dB also decreases the power of the fifth harmonic frequency relative to the fundamental frequency by an even greater amount, from about −15 dB down to a level of −35 dB. As the plots demonstrate, conditioning the channel by increasing the attenuation decreases the higher-to-lower-component power ratio between any two of the signal's frequency components as received by the monobit receiver.

An attenuation or other channel conditioning method that is statically set generally cannot maintain an optimal relative harmonic power level, especially when it is desired to have maximal receiver sensitivity and thus minimal attenuation or conditioning. An optimal balance of harmonic suppression and receiver sensitivity requires dynamic adjustment of the channel conditioner to produce continually the desired level of harmonic suppression, and in certain embodiments in accordance with the present invention this is achieved through use of a negative feedback control loop. With these considerations in mind, a harmonics-controlled monobit receiver system in accordance with certain embodiments of the present invention includes generally an input channel conditioner, the monobit receiver itself, a sensor subsystem that detects and compares selected frequency components of a particular signal to determine their power ratio, and a feedback control loop that uses that power ratio to control the channel conditioner. Within these various embodiments, different types of channel conditioner and different configurations of sensor subsystem and feedback control loop may be employed.

Figure 1:
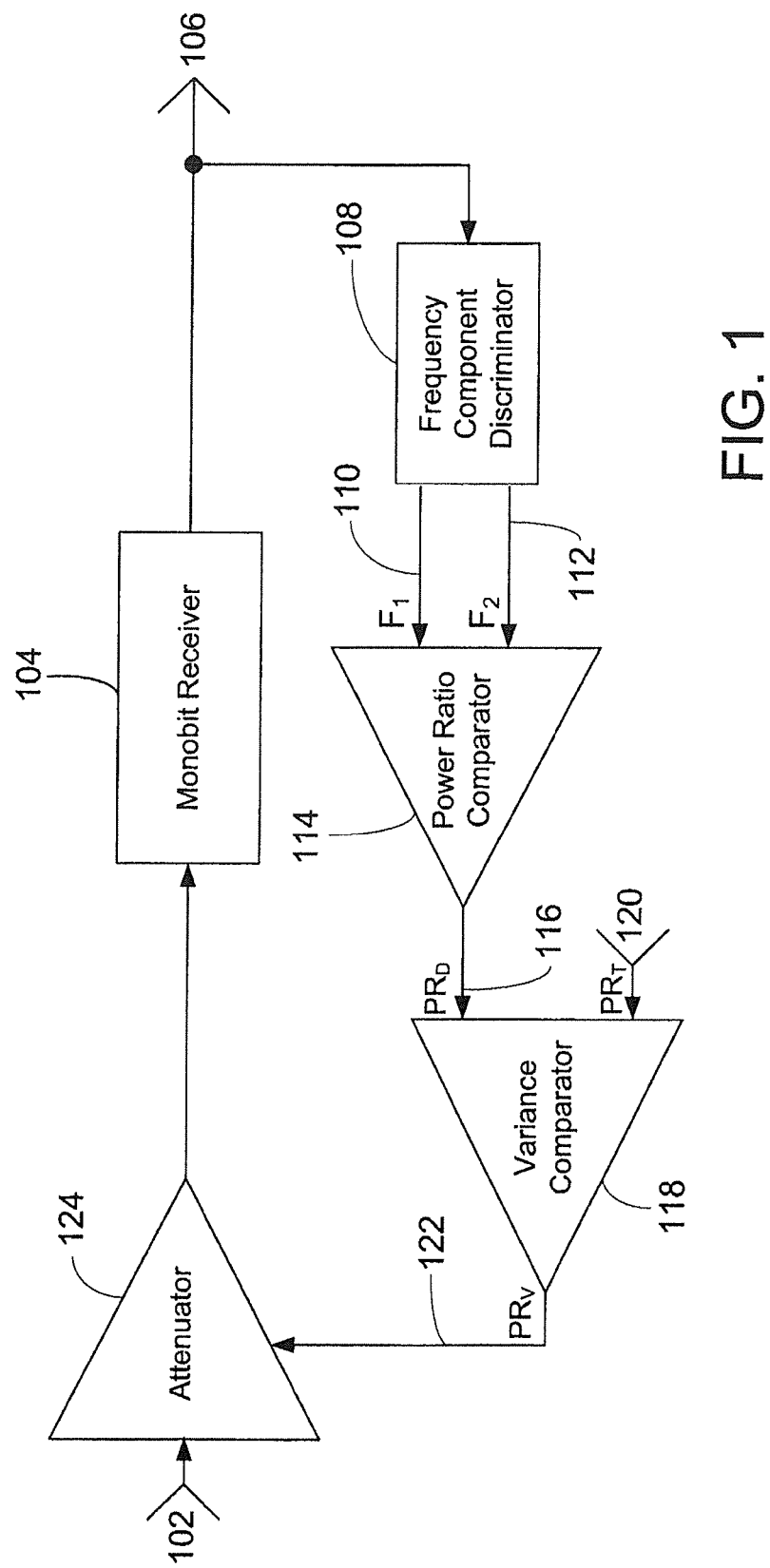
FIG. 1 is a block diagram of a system for balancing unwanted signal harmonics levels with receiver sensitivity using an attenuator as its input channel conditioner.

FIG. 1 depicts one embodiment of a monobit receiver system in accordance with the present invention in which an attenuator is used as the input channel conditioner. In this embodiment, channel input 102 is fed through attenuator 124 before feeding into monobit receiver 104, which produces received channel output 106. The output of the monobit receiver is also fed to frequency component discriminator 108, which isolates two desired frequency components of a desired signal or develops data regarding the strength of those desired frequency components. The discriminator feeds either the frequency components $F_1$ and $F_2$ themselves or data regarding the strength of first frequency component 110 and of second frequency component 112 into a power ratio comparator 114 that determines the power ratio 116 of those frequency components. That determined power ratio $PR_D$ is in turn fed into a variance comparator 118 that compares it with a selected target power ratio $PR_T$ 120 to determine the power ratio variance 122 between the determined and target ratios. That variance $PR_V$ is used to control the operation of the input channel attenuator, thus closing the feedback loop of the system.

The depicted system is configured such that the power ratio variance operates as negative feed back, driving the power ratio between the two frequency components toward the target ratio, and so driving the power ratio variance to zero. For instance, if the power ratio of a higher frequency component to a lower frequency component (e.g., third harmonic to fundamental frequency) of −17 dB is desired and set as the target ratio, then a received, determined power ratio below that target value (i.e. with a negative dB value having a magnitude larger than 17) leads to a negative power ratio variance. This causes the attenuator to decrease the attenuation, increasing the amplitude of the channel feeding into the monobit receiver. Given the characteristic behavior of such a receiver, that decrease in channel attenuation results in an increase in the power ratio, driving the value back up toward the desired −17 dB target value and the increasing the negative power ratio variance toward zero. Conversely, if the power ratio is above the desired −17 dB target value, a positive power ratio variance develops. This causes the attenuator to increase input channel attenuation, decreasing the amplitude of the channel feeding into the monobit receiver, in turn decreasing the power ratio back down toward the target value and decreasing the positive power ratio variance back toward zero. These feedback adjustments may be made continuously, or at any discrete time interval deemed beneficial or useful.

All the individual components of the system described above are straightforward, well known devices and/or processor functions in the art. The cybernetic feedback principles of this closed-loop negative feedback system are similarly quite well known to those of skill in the art. The sensitivity of the channel conditioner to the power ratio variance may be of any desired degree, so long as the algorithm under which the feedback loop operates permits cybernetic stability. It may for example be set for an overdamped, underdamped, or critically damped response. Such adjustments and algorithms are well known in the art.

Figure 2:
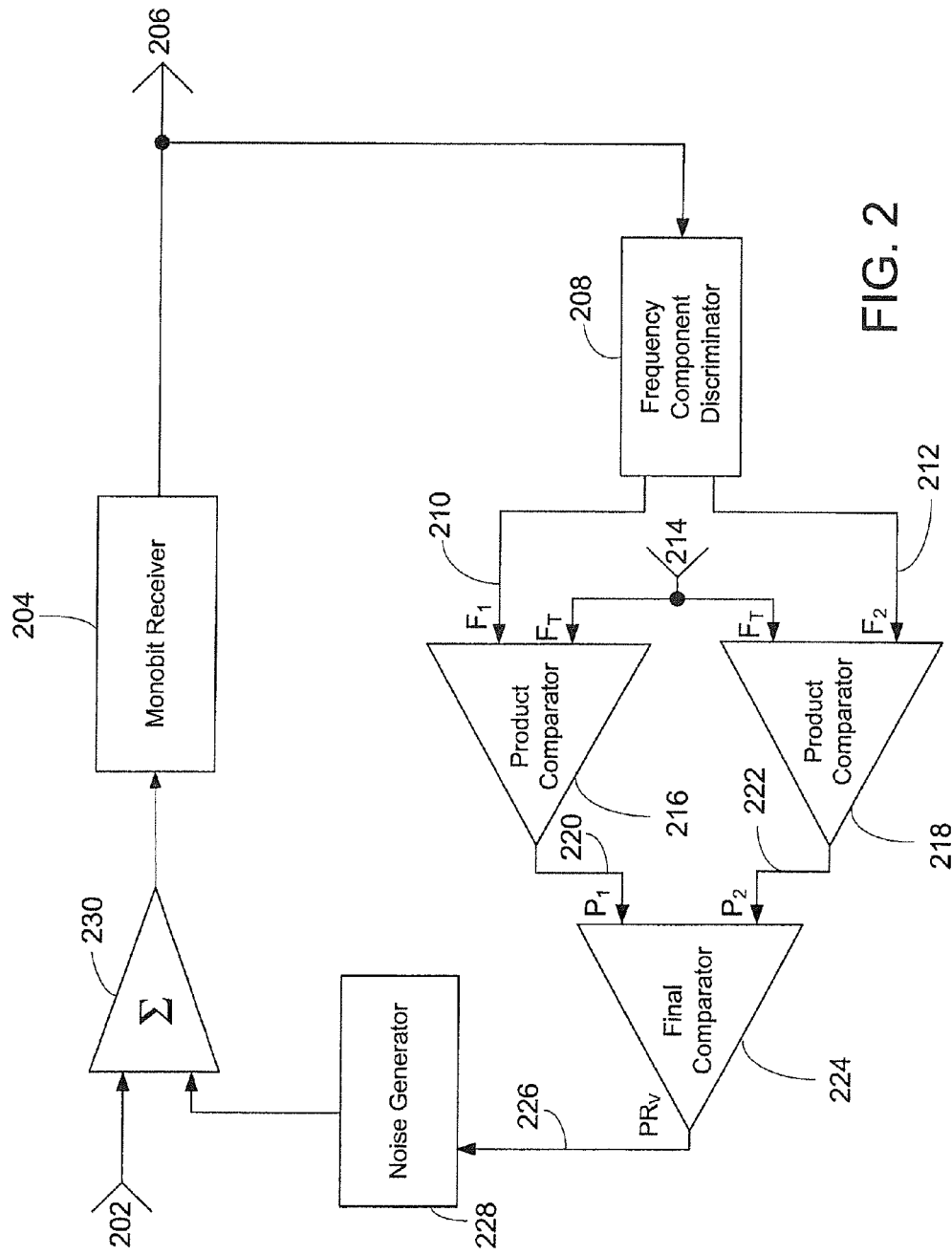
FIG. 2 is a block diagram of a system for balancing unwanted signal harmonics levels with receiver sensitivity using a noise generator and a summing combiner as its input channel conditioner.

FIG. 2 depicts another embodiment in accordance with the present invention, with its system demonstrating alternative approaches to the cybernetic loop and parameter balancing. In this embodiment a noise generator and a summing combiner are used as the input channel conditioner, and the channel conditioning is achieved by adding noise to the input channel. In FIG. 2 the channel input 202, monobit receiver 204, channel output 206, discriminator 208, and frequency components 210 and 212 are all disposed similarly to their counterparts as described above and depicted in FIG. 1. The discussion above of the system's operation pertains equally to this system up to the point where the frequency components are discriminated. Here, however, an equivalent but topologically different sensor and determination scheme is employed. Frequency strength target value 214 is compared with $F_1$ in product comparator 216 and also with $F_2$ in product comparator 218. The products $P_1$ and $P_2$ of these two comparisons, 220 and 222 respectively, are themselves compared in final comparator 224. The output 226 of that comparator is a form of power ratio variance $PR_V$ equivalent to that found in FIG. 1, and as in FIG. 1 it is fed back to the input channel conditioner. As will be recognized by those of skill in the art, whether the individual frequency components are compared between themselves first and then compared to the target value, or else the individual frequency components are first compared with a target value and then intermediate products are compared to each other, the result is the same or at least equivalent.

As a further difference in the system depicted in FIG. 2, instead of an attenuator the signal conditioner comprises noise generator 228 and input channel summing combiner 230. In this embodiment, the power ratio variance 226 is fed to noise generator 228 to control the amplitude of noise being generated. The feedback signal thus controls the amplitude of noise being added into the input channel, and that noise-added input channel is fed into the monobit receiver. The addition of noise to the channel in some ways parallels the reduction in SNR that occurs in the other embodiment when the channel is attenuated. Typically Gaussian noise or non-Gaussian uniform noise may be used, with uniform noise appearing to yield better results.

In the system depicted in FIG. 2, a lower than desired power ratio value between a higher-order frequency component and a lower-order frequency component would cause a decreased amplitude of noise to be added to the input channel. Given the characteristic behavior of monobit receivers, the decreased noise in the channel results in an increase in the power ratio, driving its value back up toward the desired target value. Conversely, if the power ratio is above the desired value, the noise generator is directed to increase the amplitude of noise added to the input channel, decreasing the power ratio down toward the desired target value. As in the system above featuring an attenuator as channel conditioner, the feedback algorithm or transfer function used may be of any type, and such algorithms and functions are well known in the art.

It should be noted that the alternative comparator configuration described in FIG. 2 is not mandated by the difference in type of channel conditioner shown there, and these are simply "mix and match" alternatives. Many different methods and approaches are available for performing processing that is equivalent to the process of first determining the relative strength of the desired frequency components and then comparing that relative strength to a desired value. Describing the process in this way perhaps best illustrates the purpose behind this signal processing, but as demonstrated by the FIG. 2 system, such processing does not have to be carried out in that form or in that order. Moreover, it is not necessary even to determine separately the strength or amplitude of the first and second frequency components; instead, a method may be employed that directly determines the power ratio or performs other such strength comparisons between the frequency components without an intermediate step of separately determining aspects of the individual frequency components themselves.

Beyond the signal attenuation and noise addition techniques discussed above, embodiments in accord with the present invention may use any form of channel conditioning that, like the techniques discussed here, decreases the monobit receiver's sensitivity and SNR. As illustrated in FIG. 4, with any such channel conditioning technique a tradeoff exists between improved harmonics attenuation and decreased receiver sensitivity, and certain embodiments in accordance with the present invention permit these competing considerations to be balanced. A user selects a desired level of harmonics rejection, as represented for example by a target power ratio between two selected frequency components, and the system uses a feedback loop to configure dynamically and continuously for the maximum receiver sensitivity consistent with the desired harmonics roll off.

Any two of a signal's frequency components can be used for determining a relative power level to drive the feedback loop. In applications such as electronic warfare where it is important to drive as many harmonics as possible down as far as possible, the two chosen frequency components may typically be the fundamental frequency and the third harmonic frequency. However, in other applications, such as synthetic aperture radar for example, the presence of certain lower-order signal harmonics may be tolerable or even beneficial, and the use of higher-order harmonics for the relative power level determination may be useful. In such applications the relative power level determination may involve frequency components such as the third and fifth harmonic frequencies. As another example, the fundamental frequency and the fifth harmonic frequency may be used and compared, since nothing in the current invention requires the determination be performed only between adjacent frequency components.

The input channel to the monobit receiver may contain multiple signals, and determination of relative frequency component strength may conceivably be performed on any of them. Selection of a particular signal for processing and driving the feedback loop typically depends on the application for which the receiver system is being employed. Selection may be as straightforward as choosing the strongest or highest power signal. Alternatively, a particular signal may be chosen for its properties, and such chosen signal may or may not be the signal of greatest interest to the overall system of which the receiver is a part. Once a particular signal has been chosen and characterized generally, for example by having its fundamental frequency determined, determination and characterization of the relevant aspects of the desired frequency components, for example their frequencies and amplitudes, is straightforward. The methods for acquiring and characterizing these signal characteristics are well known to those of skill in the art. Depending on the bandwidth of the channel, some degree of frequency aliasing may also be encountered, but again, techniques for compensating for such aliasing in characterizing the relevant aspects of the selected signal and selected frequency components are straightforward and well known to those of skill in the art.

Although the channel conditioner is typically implemented within an analog signal path, the various components depicted here may be implemented in either the digital or analog domain; further, they need not be separate components, but may instead be combined into or implemented by a unified signal processor or analyzer.

Figure 3:
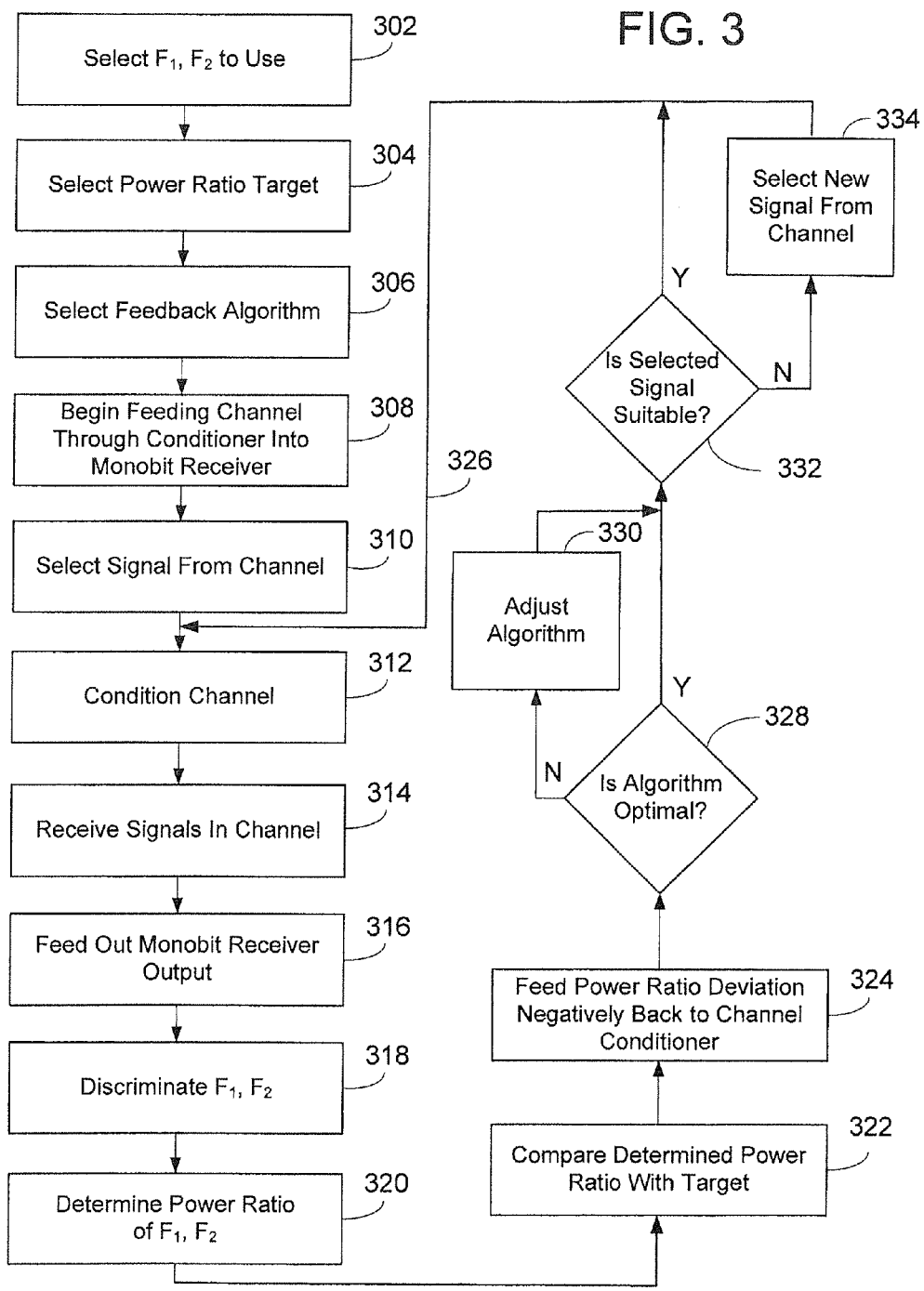
FIG. 3 is a flow chart for a method of balancing unwanted signal harmonics levels with receiver sensitivity in a system using a monobit receiver and a channel conditioner.

A flowchart for an embodiment in accordance with the present invention encompassing a method of balancing harmonic suppression and receiver sensitivity in the interest of maximizing both is shown in FIG. 3. The depicted steps need not necessarily be taken in the order shown, however. In implementing such a method, an operator of the system selects (302) which two frequency components are to be compared in gauging the harmonics suppression and driving the feedback loop. The operator further selects (304) the desired target power ratio to be applied to those two frequency components, and selects (306) the algorithm to be used, at least initially, to direct how negative feedback is applied to the channel conditioner. A channel containing one or more signals begins to be fed (308) through a channel conditioner into a monobit receiver. A signal from the channel is selected (310) for use in driving the feedback loop. The channel conditioner conditions (312) the channel and the monobit receiver receives (314) the signals in the channel. The output of the receiver is fed out (316) as the output of the system. The two selected frequency components are discriminated (318) from the selected signal, and their power ratio is determined (320). That power ratio is compared (322) to the target power ratio, and any positive or negative power ratio deviation from the target value is fed back (324) negatively to the channel conditioner to drive its level of channel conditioning in the direction tending to minimize the observed power ratio deviation.

The cycle of receiving and frequency component power ratio determination repeats iteratively (326) to drive the system toward the desired target power ratio value, and thereafter to maintain that target value when signal characteristics within the channel change. A second degree of feedback addressed to the feedback algorithm itself may be employed in which criteria are applied to the various iterations of power ratio feedback to determine (328) whether the negative feedback algorithm is optimal. Whenever it is not, the algorithm is adjusted (330) for purposes of optimizing the system. Also, the selected signal from the channel may be tested (332) for suitability, and if the signal proves unsatisfactory for driving the feedback loop it may be replaced (334) with a different signal from the channel. As well, the frequency components being compared and the target power ratio could be adjusted, either from time to time or dynamically and continuously. While this method is described as repeating iteratively, the feedback need not be applied through discrete iterations, but may instead be applied continuously.

Although limited embodiments of the present invention have been specifically described and illustrated, many modifications, combinations, and variations will be apparent to those skilled in the art. Accordingly, it is to be understood that a monobit receiver harmonics control system and method according to the principles of this invention may be embodied other than as specifically described herein. The invention is also defined in the following claims.

What is claimed is:

1. A method for reducing unwanted signal harmonics from the output of a monobit receiver, the method comprising:
    conditioning (312) a received channel over a broad spectrum, the received channel having a signal;
    processing the conditioned channel through the monobit receiver to generate an output;
    determining (318, 320) an aspect of relative strength between at least two frequency components of the output of the monobit receiver;
    determining a variance between the determined aspect of relative strength and a target value for the aspect of relative strength; and
    using the determined aspect of relative strength (322) and the determined variance to control (324) a manner in which the received channel is conditioned to urge the aspect of relative strength toward the target value.

2. The method of claim 1, wherein the step of determining an aspect of the relative strength comprises determining (320) a power ratio between at least two frequency components of the signal.

3. The method of claim 1, further comprising the step of selecting (302) at least two of the signal's frequency components to be used in the performing the step of determining an aspect of the relative strength.

4. The method of claim 1, further comprising the step of selecting (304) a particular relative strength level between the at least two frequency components to be targeted to be maintained in conditioning the channel.

5. The method of claim 1, wherein the at least two frequency components of the output of the monobit receiver upon which the step of determining an aspect of the relative strength is performed comprise the fundamental frequency of the signal and the spurious third harmonic frequency of the signal.

6. The method of claim 1, wherein conditioning the channel (312) comprises attenuating the channel.

7. The method of claim 1, wherein conditioning the channel (312) comprises adding noise to the channel.

8. The method of claim 1, further comprising the step of selecting (306) an algorithm by which a result of the relative strength determination controls the conditioning of the channel.

9. The method of claim 1, further comprising the step of selecting (310) a signal from the channel.

10. The method of claim 1, wherein the step of using the determined aspect of relative strength to control a manner in which the channel is conditioned further comprises the step of determining (322) a variance between the determined signal strength and a preselected value.

11. The method of claim 1, further comprising the step of dynamically changing at least one of signal selection (334), feedback algorithm selection (330), frequency components selection, or target power ratio selection.

12. The system of claim 1, wherein the conditioning the received channel comprises conditioning all signals within the received channel.

13. A system for receiving at least one signal in a channel through a monobit receiver and reducing unwanted signal harmonics from the monobit receiver, comprising:
    a channel conditioner (124, 228, 230) in communication with an input of the monobit receiver, disposed to process a received input channel over a broad spectrum;

a monobit receiver (104, 204) disposed to process the conditioned received input channel (102, 202) to generate an output channel; and a feedback driver (114, 118, 208, 216, 218, 224) in communication with an output of the monobit receiver and in communication with a control input of the channel conditioner, disposed to determine an aspect of a relative strength (116, 122, 220, 222, 226) between at least two frequency components of the output channel of the monobit receiver and disposed to use that determination for control of the channel conditioner in a manner that urges the aspect of the relative strength between the at least two frequency components toward a desired value, wherein the feedback driver comprises:

a first comparator (114) in communication with an output of the monobit receiver and disposed to determine an aspect of a relative strength between at least two frequency components of a received signal within the channel, and a second comparator (118) that is:

in communication with an output of the first comparator and disposed to determine a variance between the determined aspect of relative strength and a target value for an aspect of relative strength, and also in communication with a control input of the channel conditioner and disposed to use the determined variance to control the channel conditioner in a manner that urges an aspect of relative strength between at least two frequency components towards the target value for an aspect of relative strength.

14. The system of claim 13, wherein the channel conditioner comprises an attenuator (124) disposed to increase attenuation of the channel when it receives a control signal indicating that the strength of a higher-order frequency component of a received signal relative to the strength of a lower-order frequency component of that received signal is larger than desired.

15. The system of claim 13, wherein the channel conditioner comprises a noise generator (228), disposed to add noise to the channel and to increase the amplitude of that noise in the channel when it receives a control signal indicating that the strength of a higher-order frequency component of a received signal relative to the strength of a lower-order frequency component of that received signal is larger than desired.

16. The system of claim 13, wherein the feedback driver comprises at least one discriminator (108, 208) in communication with an output of the monobit receiver and disposed to determine at least one aspect of the strength of at least one frequency component of a signal received by the monobit receiver.

* * * * *